US009870012B2

(12) United States Patent
Raychowdhury et al.

(10) Patent No.: US 9,870,012 B2
(45) Date of Patent: Jan. 16, 2018

(54) DIGITALLY PHASE LOCKED LOW DROPOUT REGULATOR APPARATUS AND SYSTEM USING RING OSCILLATORS

(71) Applicant: Intel Corporation, Santa Clara, CA (US)

(72) Inventors: Arijit Raychowdhury, Hillsboro, OR (US); Dinesh Somasekhar, Portland, OR (US); James W. Tschanz, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 633 days.

(21) Appl. No.: 13/976,223

(22) PCT Filed: Sep. 25, 2012

(86) PCT No.: PCT/US2012/057066
§ 371 (c)(1),
(2) Date: Jun. 26, 2013

(87) PCT Pub. No.: WO2014/051545
PCT Pub. Date: Apr. 3, 2014

(65) Prior Publication Data
US 2015/0241890 A1    Aug. 27, 2015

(51) Int. Cl.
*G06F 1/00*    (2006.01)
*G05F 1/577*    (2006.01)
(Continued)

(52) U.S. Cl.
CPC .............. *G05F 1/577* (2013.01); *G05F 1/468* (2013.01); *G05F 1/56* (2013.01); *G06F 1/06* (2013.01);
(Continued)

(58) Field of Classification Search
CPC ................................................. G06F 1/04–1/10
See application file for complete search history.

(56) References Cited

U.S. PATENT DOCUMENTS 5,506,531 A * 4/1996 Jang ........................ H03L 7/199
327/156
6,177,787 B1    1/2001 Hobrecht
(Continued)

FOREIGN PATENT DOCUMENTS

WO    2007027773    3/2007
WO    2014/051545 A1    4/2014

OTHER PUBLICATIONS

Second Office Action for Taiwan Patent Application No. 102132796, dated Mar. 24, 2015 Translation provided.
(Continued)

*Primary Examiner* — Mohammed Rehman
(74) *Attorney, Agent, or Firm* — Green, Howard & Mughal LLP

(57) ABSTRACT

Described is an apparatus which comprises: a first oscillator to generate a first clock signal a second oscillator to generate a second clock signal; a phase frequency detector to detect phase difference between the first and second clock signals, and to generate a phase difference; and an output stage, coupled to a load, to generate a power supply for the load according to the phase difference.

27 Claims, 13 Drawing Sheets

(51) Int. Cl.
   *G05F 1/56* (2006.01)
   *G05F 1/46* (2006.01)
   *G06F 1/06* (2006.01)
   *G06F 1/26* (2006.01)
   *H03L 7/085* (2006.01)

(52) U.S. Cl.
   CPC ............... *G06F 1/26* (2013.01); *H03L 7/085*
   (2013.01); *Y10T 307/406* (2015.04)

(56) References Cited

U.S. PATENT DOCUMENTS

| | | | |
|---|---|---|---|
| 6,504,438 B1 | 1/2003 | Chang et al. | |
| 6,809,567 B1 * | 10/2004 | Kim | G06F 1/06 327/115 |
| 7,276,885 B1 | 10/2007 | Tagare | |
| 2002/0084816 A1 * | 7/2002 | Harris | H03L 7/183 327/159 |
| 2003/0119474 A1 * | 6/2003 | Kimura | H04B 1/30 455/333 |
| 2005/0046489 A1 | 3/2005 | Cranford | |
| 2006/0209992 A1 * | 9/2006 | Tomita | H04L 27/144 375/334 |
| 2007/0071156 A1 * | 3/2007 | Gregorius | H03L 7/087 375/376 |
| 2007/0200641 A1 * | 8/2007 | Sen | H03K 3/0315 331/57 |
| 2007/0216460 A1 * | 9/2007 | Yoshizawa | H03K 5/15093 327/218 |
| 2008/0036638 A1 * | 2/2008 | Suzuki | H03M 1/14 341/155 |
| 2008/0186082 A1 * | 8/2008 | Singh | H03K 19/00384 327/539 |
| 2008/0252353 A1 | 10/2008 | Kim et al. | |
| 2010/0085122 A1 * | 4/2010 | Carbone | H03B 27/00 331/45 |
| 2010/0164567 A1 * | 7/2010 | Kim | G05F 1/56 327/153 |
| 2011/0012656 A1 * | 1/2011 | Sumita | G06F 1/10 327/163 |
| 2013/0304992 A1 * | 11/2013 | Lee | G06F 12/0811 711/122 |
| 2014/0258680 A1 * | 9/2014 | Ingle | G06F 9/38 712/205 |

OTHER PUBLICATIONS

International Search Report and Written Opinion issued for International Patent Application No. PCT/US2012/05766, dated Apr. 30, 2013, 11 pages.
First Notification for Rectification issued for Chinese Patent Application No. 20130612785.9, dated Jan. 13, 2014, 5 pages.
Notice of Allowance received for Chinese Patent Application No. 201320612785.9 , dated Apr. 15, 2014, 2 Pages of Notice of Allowance and 1 Page of English Translation.
Taiwan Office Action dated Dec. 10, 2014 for TW Patent Application No. 102132796 (23 pages-English and Taiwanese).
Raychowdhury et al., "A Fully-Digital Phase-Locked Low Dropout Regulator in 32nm CMOS", IEEE 2012 Symposium on VLSI Circuits Digest of Technical Papers, Jun. 13-15, 2012, pp. 148-149 (2 pages).
International Preliminary Report on Patentability for International Patent Application No. PCT/US2012/057066, dated Apr. 9, 2015.
Extended European Search Report, dated Aug. 30, 2016, for European Patent Application No. 12885472.6.

* cited by examiner

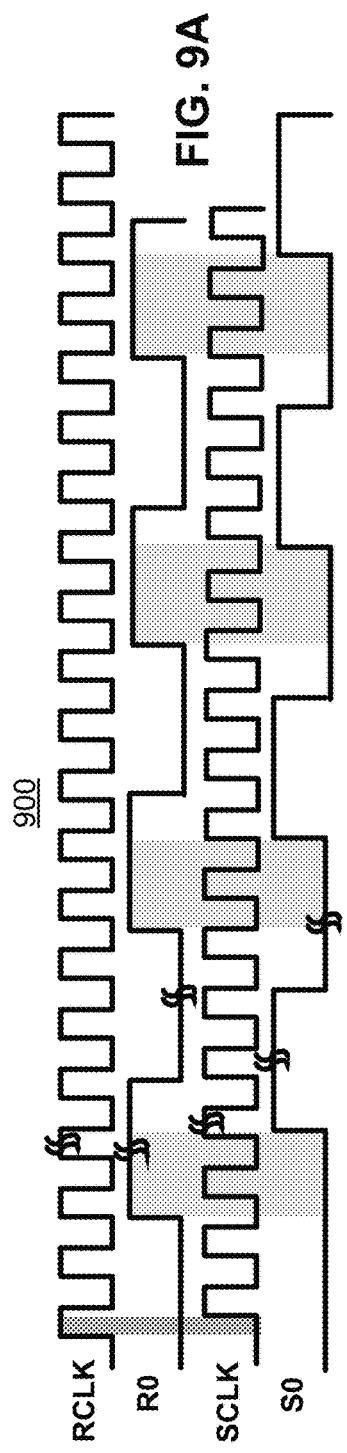
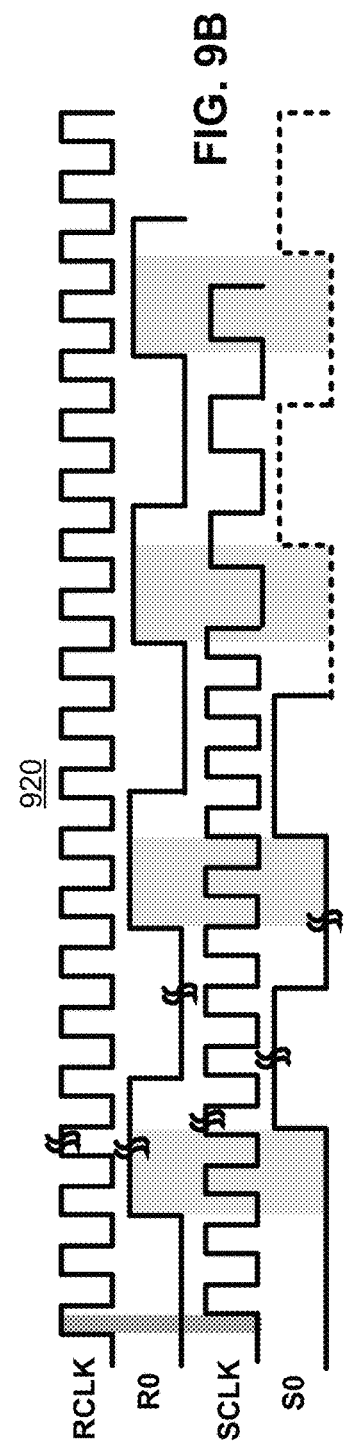
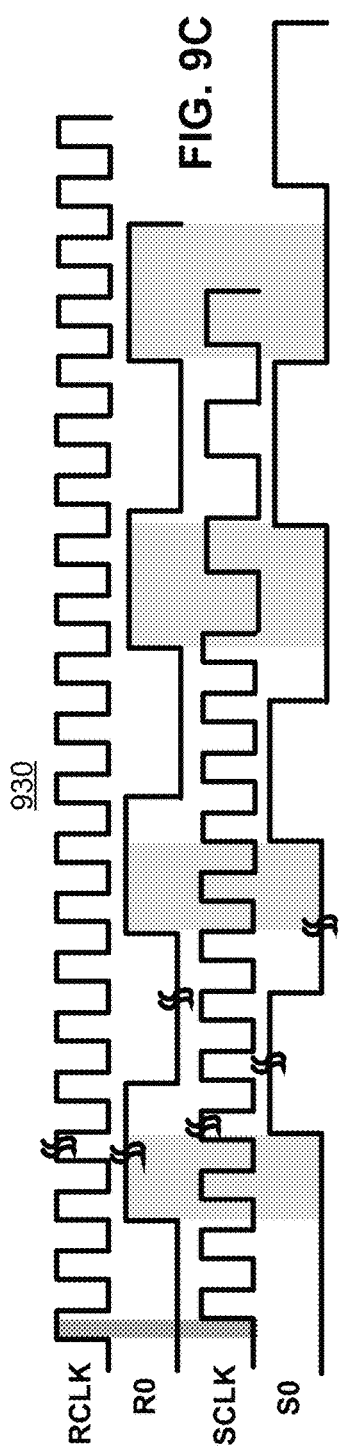

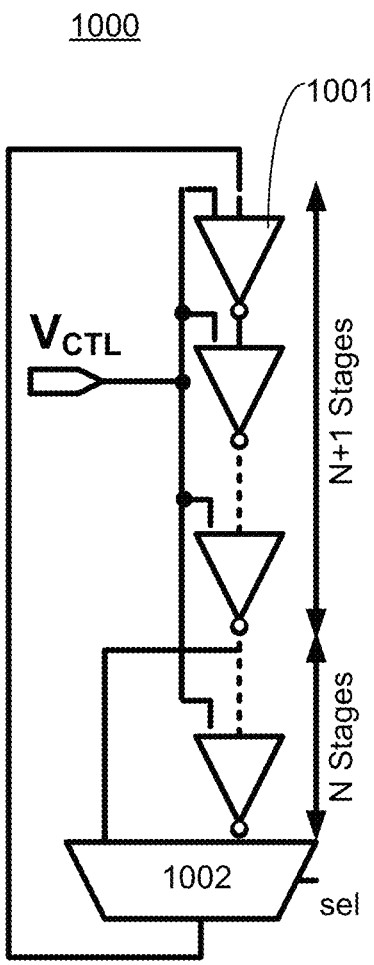 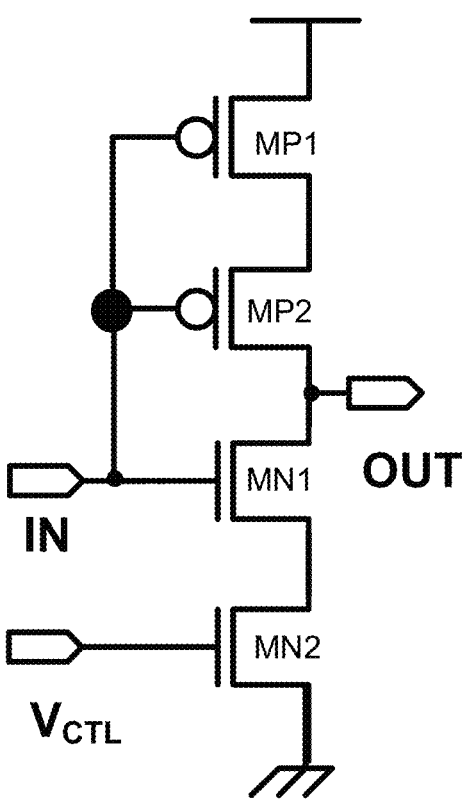
FIG. 10A  FIG. 10B

DIGITALLY PHASE LOCKED LOW DROPOUT REGULATOR APPARATUS AND SYSTEM USING RING OSCILLATORS

GOVERNMENT LICENSE RIGHTS

This invention was made with Government support under contract number HR0011-10-3-0007 awarded by the Department of Defense. The Government has certain rights in this invention.

CLAIM OF PRIORITY

This application claims the benefit of priority of International Patent Application No. PCT/US2012/057066 filed Sep. 25, 2012, titled "DIGITALLY PHASE LOCKED Low DROPOUT REGULATOR," which is incorporated by reference in its entirety.

BACKGROUND

Fine-grained voltage domains have become the norm in processors. The term "voltage domain" herein refers to sections of the processor or integrated circuit (IC) that operate on a particular voltage supply. For example, parts of a processor operate on a higher supply, e.g., input-output (I/O) transceivers, while other parts of the processor, e.g., the execution unit, may operate at a lower power supply. In this example, the I/O transceivers are part of a first voltage domain while the execution unit may be part of another voltage domain. The voltage domains may have slight differences between the voltage power supply levels. For example, the first voltage domain may require 1.2V while the second voltage domain may require 0.8V power supply. Such fine-grained voltage domains make power delivery and voltage regulation a challenging task.

BRIEF DESCRIPTION OF THE DRAWINGS

Embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 9A-C illustrates a transient operation of the digitally phase locked LDO regulator, according to one embodiment of the disclosure.

FIG. 10A-B is a current starved oscillator for the digitally phase locked LDO regulator, according to one embodiment of the disclosure.

DETAILED DESCRIPTION

Figure 1A:
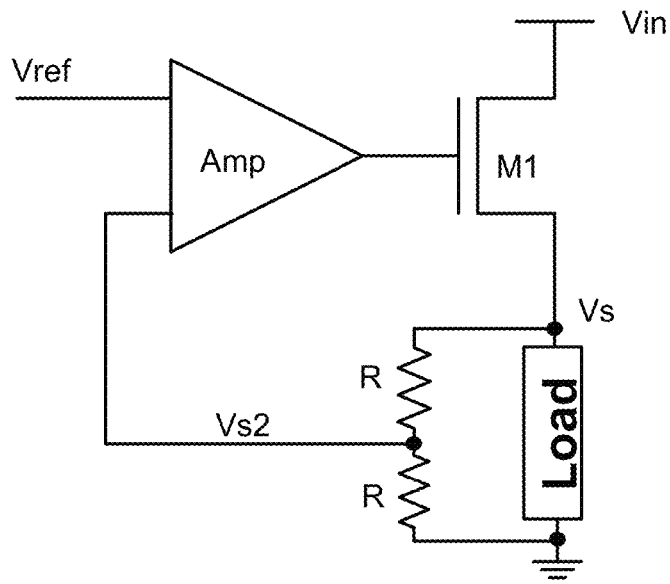
FIG. 1A is an analog low dropout (LDO) regulator.

Low dropout (LDO) regulators are voltage regulators (VRs) that may be used for high-speed adjustments to the power supply. FIG. 1A is a conventional analog LDO regulator 100. The analog LDO 100 includes an amplifier (Amp) that drives a gate terminal of a transistor M1 which receives an input power supply Vin and provides a regulated voltage Vs to the load. The output power supply Vs, or its divided version Vs2, is compared with a reference voltage Vref by the amplifier. This negative feedback sets the voltage the gate terminal of M1 so that Vs2 is substantially equal to Vref.

The LDO regulation is manifested when the load current changes (e.g., because the demand for current increased by the load) which in turn causes the voltage Vs to lower its previous value. A lower level of Vs causes the amplifier to turn on M1 harder to raise the level of Vs2 to be substantially equal to Vref, and thus regulating Vs. The feedback loop suppresses an error voltage. The analog LDO regulator 100 may provide high bandwidth, fast response time, high power supply rejection ratio (PSSR), and little ripple on Vs, but such an analog LDO regulator is incompatible with digital design flow because analog components (e.g., the amplifier) do not scale in size and in operating voltage as voltage and process technology scales over time.

Figure 1B:
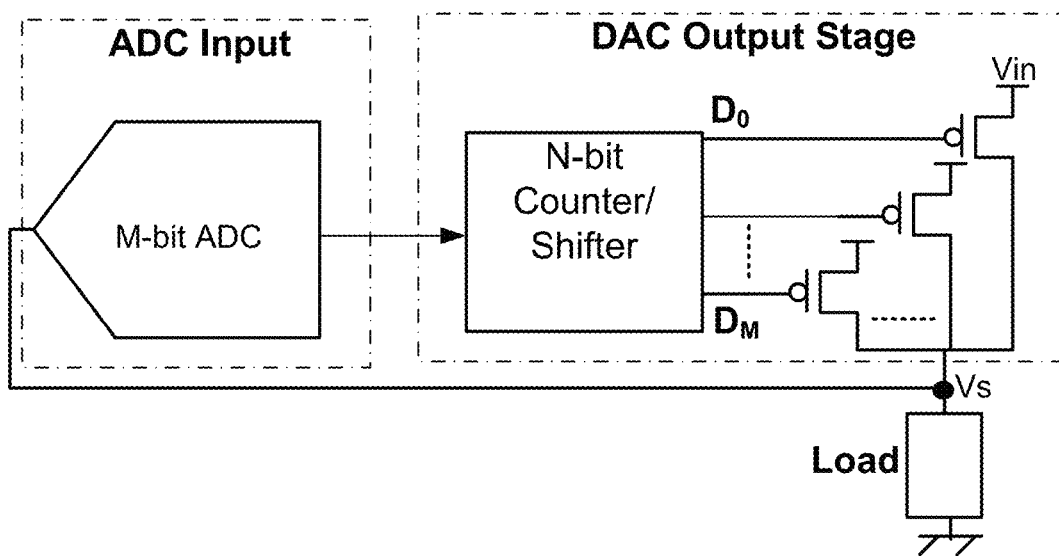
FIG. 1B is a digital LDO regulator.

FIG. 1B is a digital LDO regulator 110 which replaces the analog amplifier of FIG. 1A with an M-bit analog to digital converter (ADC), an N-bit counter or shifter, and 'M' number of digitally controlled transistors to provide power supply to the load, where 'M' and 'N' are integers. While the digital LDO regulator 110 is compatible with the digital design flow, because it may scale with voltage and process technologies, it suffers from other issues.

For example, digital LDO regulator 110 has lower bandwidth than the analog LDO regulator 100 of FIG. 1A. This means that when voltage on node Vs overshoots or undershoots due to changing load conditions (e.g., the load may require more current than before or lesser current than before), the long loop of the digital LDO regulator 110 comprising the M-bit ADC and N-bit counter takes more time to respond to the Vs overshoots or undershoots than the analog LDO regulator 100 of FIG. 1A which has a faster feedback loop. The M-bit ADC of the digital LDO regulator 110 also performs small signal sensing to sense the feedback voltage Vs with a number of reference voltages, and so the M-bit ADC is prone to offsets and mismatches. The digital to analog converter (DAC) of the digital LDO regulator 110 also suffers from at least one least significant bit (LSB) error at the output node Vs which adds error to the regulation behavior of the LDO regulator.

The embodiments describe a digitally phase locked LDO regulator that provides the benefits of the analog LDO and the digital LDO without their corresponding drawbacks. For example, the digitally phase locked LDO regulator provides an arbitrarily small phase resolution and small or no ripple around the reference voltage Vref, achieves faster response time than the digital LDO 110 because it employs a faster feedback loop, and is stable because it provides a dominant pole at the origin (i.e., at s=0). In one embodiment, the digitally phase locked LDO regulator is based on a second-order phase-locked loop that can regulate supply voltage for a wide range of load currents. Other technical effects will be evident from various embodiments discussed herein.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on." The terms "substantially," "close," "approximately," herein refer to being within +/−20% of a target value.

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments described herein, the transistors are metal oxide semiconductor (MOS) transistors, which include drain, source, gate, and bulk terminals. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The terms "MN" herein indicates an n-type transistor (e.g., NMOS, NPN BJT, etc) and the term "MP" indicates a p-type transistor (e.g., PMOS, PNP BJT, etc).

Figure 2A:
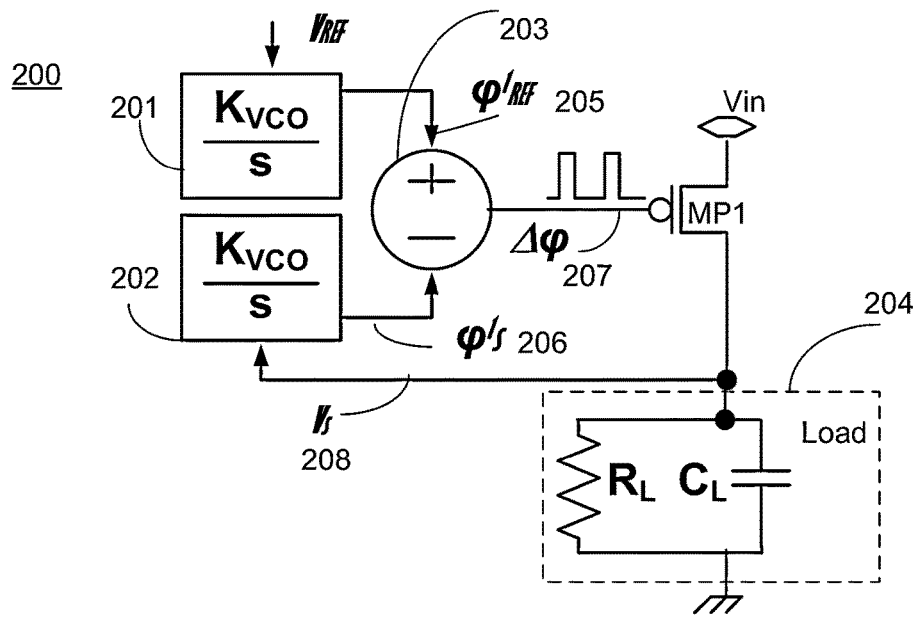
FIG. 2A is a digitally phase locked LDO regulator, according to one embodiment of the disclosure.

FIG. 2A is a digitally phase locked LDO regulator 200, according to one embodiment of the disclosure. In one embodiment, digitally phase locked LDO regulator 200 comprises a first oscillator 201, a second oscillator 202, a phase detector 203, and an output stage MP1. In one embodiment, first oscillator 201 receives a first reference voltage Vref and generates a first clock signal 205 $\Phi^1$ (RCLK). In one embodiment, the first reference voltage Vref is generated by a reference generator (not shown). In one embodiment, the reference generator is an on-die reference generator. In another embodiment, the reference generator resides outside of the die and is received by the die via a pin and then routed to the first oscillator 201. In one embodiment, the reference generator comprises a bandgap reference generator. In other embodiments, other forms of reference generators may be used, for example, a resistor divider network.

In one embodiment, second oscillator 202 receives a control voltage indicative of the power supply voltage Vs 208 to the load 204 to generate a second clock signal 206 $\Phi^1$s (SCLK). In one embodiment, the second oscillator 202 receives Vs 208 to generate a second clock signal 206 $\Phi^1$s.

In one embodiment, first 201 and second 202 oscillators are voltage control oscillators (VCOs) with substantially the same design i.e., same voltage-frequency gain characteristics (Kvco/s). In one embodiment, first 201 and second 202 oscillators have identical designs. In one embodiment, first 201 and second 202 oscillators have substantially the same or identical floor plans. The term "floor plan" herein refers to physical layout of a circuit including positions of contacts, vias, transistor width (W), transistor length (L). Circuits with identical floor plans refer to circuits having identical physical layout, same positions of contacts and vias, and identical transistor widths (W) and transistor lengths (L). In one embodiment, first 201 and second 202 oscillators are digitally controlled oscillators (DCO) that are controllable by digital versions of Vref and Vs, respectively.

In one embodiment, phase frequency detector 203 receives the first and second clock signals 205 and 206 and detects a phase difference 207 $\Delta\Phi$ between the first and second clock signals 205 and 206. In one embodiment, phase difference 207 $\Delta\Phi$ controls the on/off times of the output stage MP1 and thus regulates the output power supply Vs 208. In one embodiment, the feedback mechanism (e.g., feedback of Vs 208 to the second oscillator 202) causes the output stage MP1 to turn on/off such that Vs 208 is substantially equal to Vref. When Vs 208 is substantially equal to Vref, the LDO 200 is considered phase locked. In such an embodiment, the output power supply Vs 208 is regulated for a specific load condition (i.e., current draw) of the load 204. In one embodiment, when the load condition changes, Vs 208 changes causing the loop to re-adjust by changing the timings of the turn on/off of the output stage and to reach a new stable point where Vs 208 becomes substantially equal to Vref.

In one embodiment, phase frequency detector 203 comprises an exclusive-OR (XOR) logic gate that receives RCLK 205 and SCLK 206 and generates a phase difference 207 $\Delta\Phi$ between RCLK 205 and SCLK 206. In this embodiment, the XOR logic gate can detect a phase difference from $-\pi/2$ to $\pi/2$.

In one embodiment, phase frequency detector 203 comprises two data flip-flops (FFs) that receive RCLK 205 and SCLK 206 at their respective clock inputs. In one embodiment, the data inputs of the two data FFs are tied to logical high. In one embodiment, the outputs of the two data FFs are compared (or received) by a NAND logic gate which generates an output signal received by the reset input of the data FFs. In one embodiment, one of the outputs of the data FFs indicates the phase difference 207 $\Delta\Phi$. In this embodiment, phase frequency detector 203 can detect a phase difference from $-\pi$ to $\pi$. In one embodiment, phase frequency detector 203 comprises a Johnson Counter which is discussed later with reference to FIGS. 4-9.

Referring back to FIG. 2A, in one embodiment the output stage comprises a p-type transistor MP1 that receives the signal indicating the phase difference 207 $\Delta\Phi$ at its gate terminal. In one embodiment, source/drain terminal of MP1 is coupled to Vin, the input voltage supply, while the drain/source terminal of MP1 is coupled to the load 204 and provides the regulated voltage Vs 208 to the load 204. The load 204 is represented with lumped resistive load $R_L$ and capacitive load $C_L$. In one embodiment, the load 204 is a processor core. In one embodiment, the load 204 is a cache/memory. In one embodiment, the load 204 is any logic portion of the processor core.

Figure 2B:
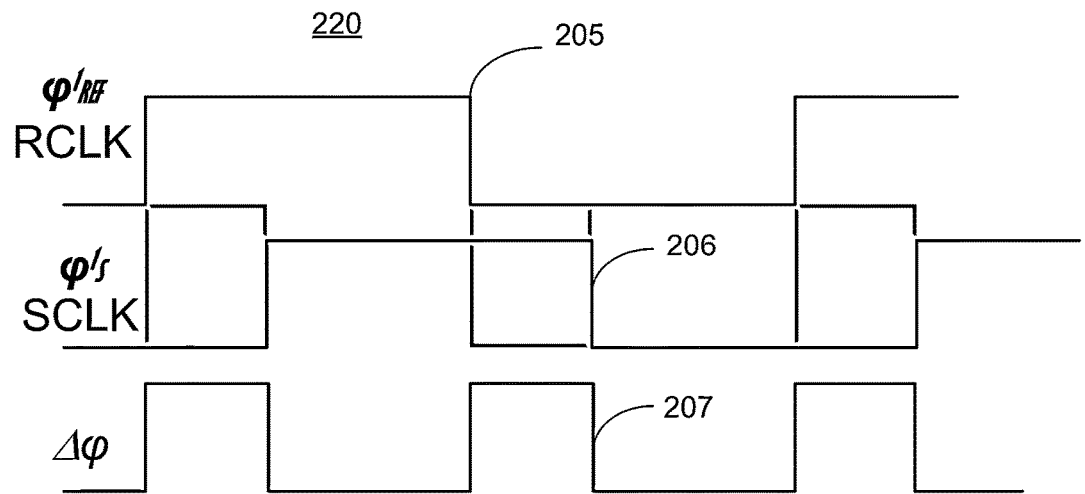
FIG. 2B is a timing diagram of the digitally phase locked LDO regulator, according to one embodiment of the disclosure.

FIG. 2B is a timing diagram 220 of the digitally phase locked LDO regulator 200, according to one embodiment of the disclosure. Signal RCLK 205 is generated by the first oscillator 201 which receives a substantially constant Vref for controlling the frequency of RCLK 205. Signal SCLK 206 is generated by the second oscillator 202 which receives Vs 208 for controlling the frequency of SCLK 206. The shaded regions in the timing diagram 220 illustrate the phase difference between RCLK 205 and SCLK 206. The phase difference 207 is generated by the phase detector 203. The phase difference 207 is used for controlling the current strength of the output stage MP1.

Figure 2C:
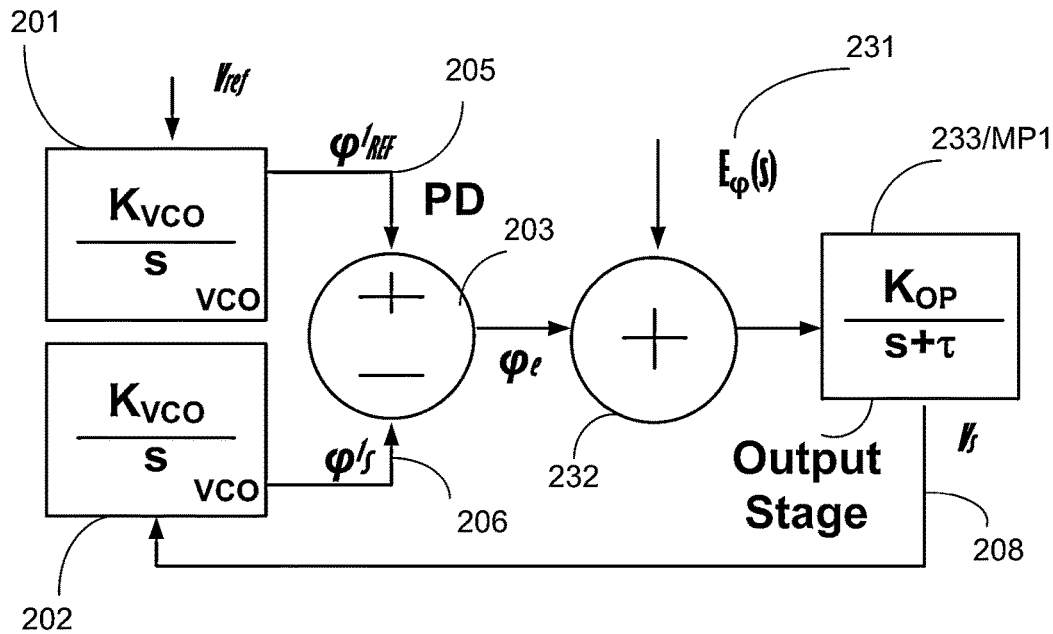
FIG. 2C is a small signal Laplace Model of the digitally phase locked LDO regulator, according to one embodiment of the disclosure.

FIG. 2C is a small signal Laplace Model 230 of the digitally phase locked LDO regulator 200, according to one embodiment of the disclosure. The small signal model 230 may be used for modeling and simulating the digitally phase locked LDO regulator 200. In this embodiment, the small signal model 230 is a second-order system with two sources of error which are modeled by $E\Phi(s)$ 231. In one embodiment, error $E\Phi(s)$ 231 is added to the phase difference 207 by the adder 232. The output stage 233/MP1 then generates Vs 208 according to the phase difference 207 in view of the error $E\Phi(s)$ 231.

In one embodiment, the first source of error is any mismatch between the first and second oscillators 201 and 202. The term "mismatch" herein refers to electrical characteristics of the first and second oscillators 201 and 202. For example, the two oscillators generate slightly different oscillation frequencies for signals 205 and 206 for the same control voltage i.e., when Vref=Vs. In one embodiment, the first source of error is corrected by "chopping."

The term "chopping" refers to the process by which systematic offset of the first and second oscillators 201 and 202 is corrected by selectively coupling Vs 208 to the first oscillator 201 and by selectively coupling Vref to the second oscillator 202 such that 205 represents SCLK and 206 represents RCLK. During chopping, the inputs 205 and 206 to the phase detector 203 are also swapped.

In one embodiment, the second source of error is the phase error and jitter of the SCLK 205 and RCLK 206. The term "jitter" generally refers to the uncertainty in generating the edges of SCLK and RCLK due to random noise, for example, thermal noise, shot noise, etc. The term "phase error" generally refers to the error in phase between any two cycles of SCLK or RCLK.

In FIG. 2C, $K_{OP}$ refers to the gain of the output stage, $K_{VCO}$ refers to the gain (voltage to phase) of the VCO, $G_{M\_SS}$ refers to the effective small signal conductance of the output PMOS, $r_{ds}$ refers to the resistance of the output PMOS, $r_{LOAD}$ refers to the resistance and $C_{LOAD}$ refers to the capacitance of the load. In one embodiment, model 230 is used in any numerical tool, for example, MATLAB or any circuit simulation software like VHDL (hardware description language) to evaluate performance and stability of the LDO dynamics.

Figure 3:
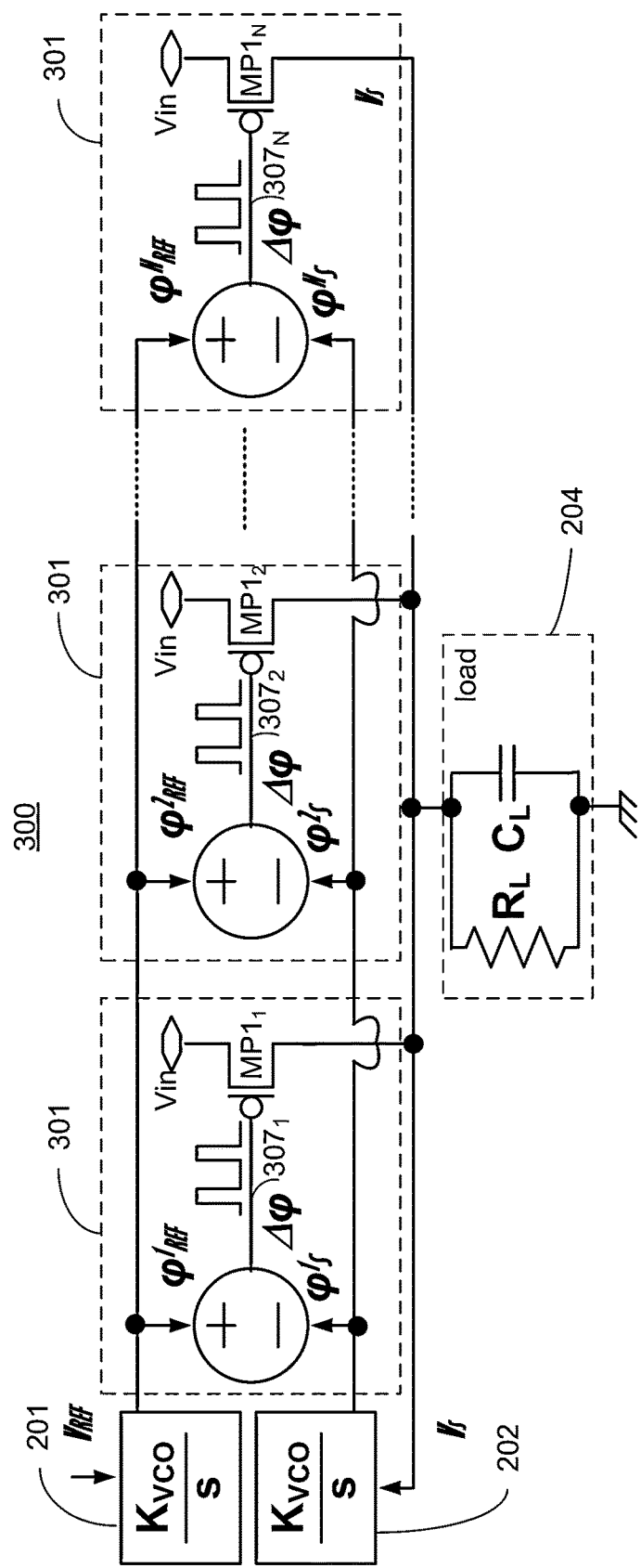
FIG. 3 is a plurality of digitally phase locked LDO regulators for multi-phase voltage regulation, according to one embodiment of the disclosure.

FIG. 3 is a plurality of digitally phase locked LDO regulators 300 for multi-phase voltage regulation, according to one embodiment of the disclosure. In one embodiment, multi-phase voltage regulation is achieved by a series of digitally phase locked LDO regulators $301_{1-N}$ providing Vs to the load 204, where 'N' is an integer. In one embodiment, each of the digitally phase locked LDO regulators $301_{1-N}$ receives different phases ($\Phi^{1-N}$) from the first and second oscillators 201 and 202, and where these different phases control the duty cycles of $307_{1-N}$ (same as 207 in FIG. 2A) to the inputs of the corresponding output stages $MP1_{1-N}$. For example, 'N' is 32 indicating a 32 bit Johnson Counter which may generate 32 different phases ($\Phi^{1-32}$ and $\Phi^{1-N}_{(s)}$) from the RCLK and SCLK, where RCLK and SCLK are generated by the first and second oscillators 201 and 202, respectively.

In this embodiment, each of the digitally phase locked LDO regulators $301_{1-N}$ regulates the voltage Vs in parallel by comparing output phase ($\Phi^{1-N}$ and $\Phi^{1-N}_{(s)}$) per stage ($301_{1-N}$). For example, at any one time at least one of the digitally phase locked LDO regulators $301_{1-N}$ is active and can respond to transient load change in the load 204. In one embodiment, the load current is provided by the power transistors (output stage) $MP1_{1-N}$ in a time interleaved fashion. In such an embodiment, the power transistor $MP1_1$ first provides current to the load for a time interval that corresponds to the phase difference $\Delta\Phi$. Next the power transistor $MP1_2$ turns on and provides the load current. In one embodiment, this process is repeated all the way to $MP1_{32}$ and the process is again repeated. In one embodiment, over a long time scale the total current to the load is provided by each power transistor one at a time. In one embodiment, there may be overlaps in providing current i.e., when more than one power transistor is turned on simultaneously and provides load current.

Figure 4A:
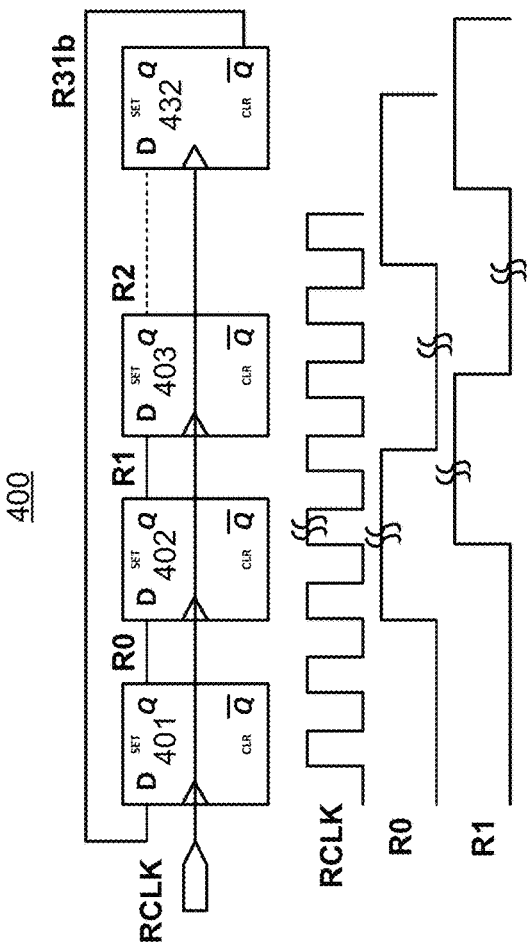
FIGS. 4A-B illustrates a Johnson Counter ring used as phase detector in a digitally phase locked LDO regulator, according to one embodiment of the disclosure.
Figure 4B:
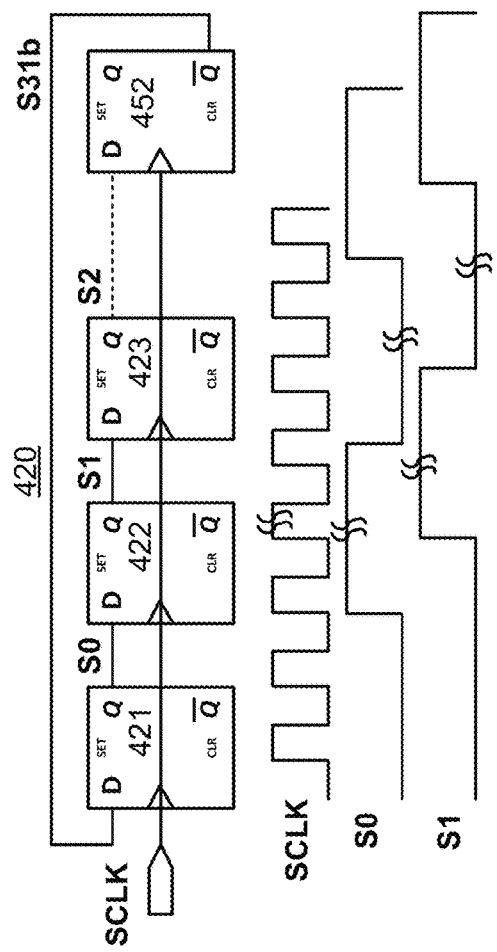

FIGS. 4A-B illustrates a Johnson Counter rings 400 and 420 used as phase detector 203 in the digitally phase locked LDO regulator 200, according to one embodiment of the disclosure. In the following exemplary embodiments, 32-bit Johnson Counter rings 400 and 420 are considered. However, fewer or more than 32 bits may be used for implementing the Johnson Counter rings 400 and 420.

FIG. 4A illustrates a 32 bit Johnson Counter 400 that is clocked by RCLK 205 generated by the first oscillator 201. In one embodiment, Johnson Counter 400 comprises 32 data flip-flops (FFs) 401-432, where R0-R31 are state nodes of the Johnson Counter 400. In one embodiment, R31b (inverse of R31) of the last FF 432 is fed back as input to the data terminal of the first FF 401 forming a free running counter. In this embodiment, Johnson Counter 400 is a 32-bit counter and so each state node R0-R31 is 32 times slower than the RCLK 205, and each state node is phase shifted relative to its neighboring phase by one clock cycle of RCLK 205. For example, R1 is 32 times slower than the RCLK 205 and is phase shifted related to R0 by one cycle of RCLK 205.

FIG. 4B illustrates a 32 bit Johnson Counter 420 that is clocked by SCLK 206 (FIG. 2) generated by the second oscillator 202. In one embodiment, Johnson Counter 420 comprises 32 data FFs 421-452, where S0-S31 are state nodes of the Johnson Counter 420. In one embodiment, S31b (inverse of S31) of the last FF 452 is fed back as input to the data terminal of the first FF 421 forming a free running counter. In this embodiment, Johnson Counter 420 is a 32-bit counter and so each state node S0-S31 is 32 times slower than the SCLK 206, and each state node is phase shifted relative to its neighboring phase by one clock cycle of SCLK 206. For example, S1 is 32 times slower than the SCLK 206 and is phase shifted related to S0 by one cycle of SCLK 206.

In steady state, SCLK and RCLK have the same frequency and the phase difference between the respective state nodes is substantially fixed. For example, phase difference between S0 and R0 is substantially fixed.

Referring back to FIG. 3, each of the digitally phase locked LDO regulators $301_{1-N}$ generates a phase difference between corresponding state nodes of the Johnson Counter 400 and 420 to generate the control signal for the output stage. For example, the phase detector 203 of the digitally phase locked LDO regulator $301_1$ compares R0 ($\Phi^1$ Ref) and S0 ($\Phi^1_{(s)}$) to generate $\Delta\Phi$ for controlling the gate of $MP1_1$. Likewise, the phase detector 203 of the digitally phase locked LDO regulator $301_2$ compares R1 ($\Phi^2$ Ref) and S1 ($\Phi^2_{(s)}$) to generate $\Delta\Phi$ for controlling the gate of $MP1_2$. In this embodiment, when load condition of load 204 changes (for example, when the load 204 demands more or less current than its previous consumption), at least one of the digitally phase locked LDO regulators $301_{1-N}$ is active which will try to regulate Vs due to change in Vs (caused by change in load condition).

For example, when the load 204 demands more current, Vs reduces from its previous level causing the second oscillator 202 to slow down relative to its previous frequency. The slower second oscillator 202 will cause the phases of the state nodes S0-S31 to increase (expand) relative to their previous phases. As the phases of the state nodes S0-S31 increase, the phase difference between the state nodes R0-R31 and S0-S31 increases causing the output stage to turn on for a longer time till Vs rises again and becomes substantially equal to Vref resulting in a new steady state condition for the LDO regulator.

Figure 5:
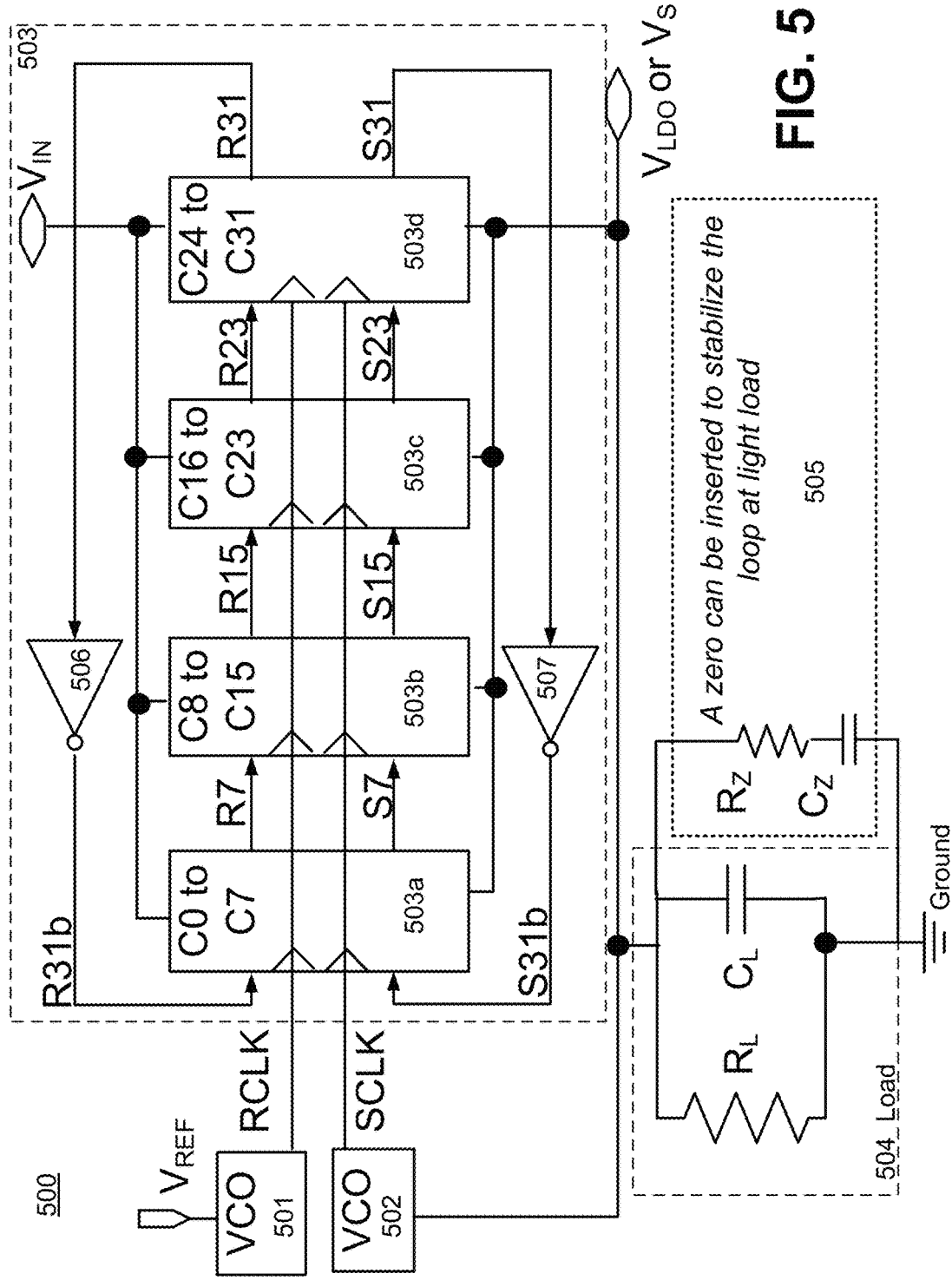
FIG. 5 is a high level architecture of Johnson Counter based digitally phase locked LDO regulator, according to one embodiment of the disclosure.

FIG. 5 is a high level architecture of Johnson Counter based digitally phase locked LDO regulator 500, according to one embodiment of the disclosure. In one embodiment, Johnson Counter based digitally phase locked LDO regulator 500 comprises a first oscillator 501 (same as 201), a second oscillator 502 (same as 202), and an 'N' bit Johnson Counter with embedded output stage 503. In the following discussion 'N' is considered to be 32. However, 'N' can be greater or less than 32.

In one embodiment, the 'N' bit Johnson Counter with embedded output stage 503 provides a regulated supply Vs (or $V_{LDO}$) to a load 504 which is represented as a lumped load with resistance $R_L$ and capacitance $C_L$. The load 504 can be a distributed load. In one embodiment, a zero can be inserted via an RC network (Rz and Cz) 505 coupled to the load 504 to stabilize the feedback loop (from Vs to the second oscillator 502, and 'N' bit Johnson Counter with embedded output stage 503) when the load 504 reduces (e.g., when the load 504 consumes less current than before).

In one embodiment, the 32-bit Johnson Counter with embedded output stage 503 comprises four sections 503a-d with eight stages each—C0-C7, C8-C15, C16-C23, and C24-C31. In one embodiment, the output of each stage of the eight stages is input to the next stage, while the output of the last stage 503d is inverted by inverters 506 and 507 before being input to the first stage 503a. In this embodiment, the 32-bit Johnson Counter provides 32 phases of RCLK and SCLK generated by the first and second oscillators 501 and 502 respectively. In this embodiment, the state nodes (not shown) are XORed to obtain a phase difference per stage.

Figure 6:
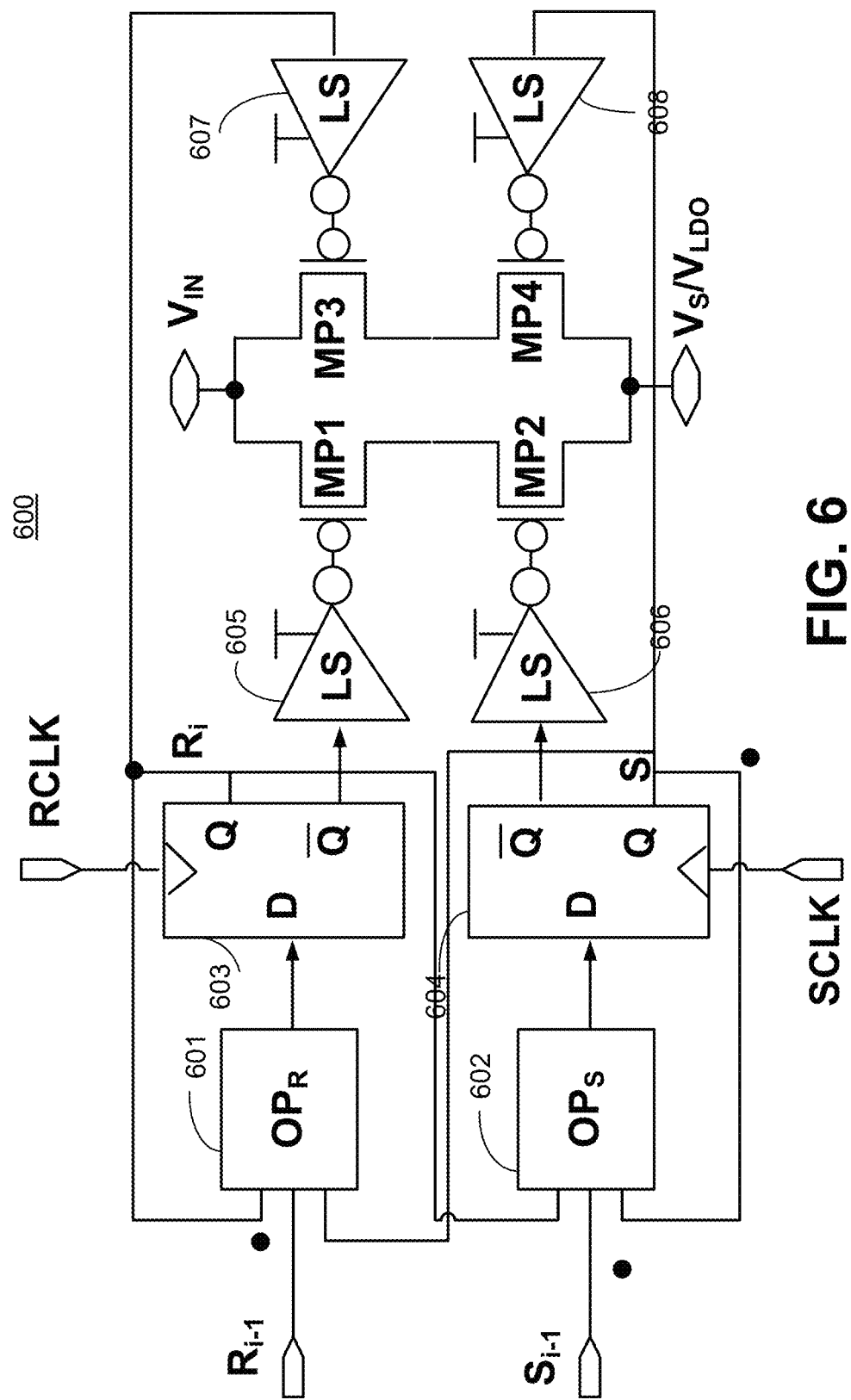
FIG. 6 is a Johnson Counter stage of a multi-stage Johnson Counter based digitally phase locked LDO regulator, according to one embodiment of the disclosure.

FIG. 6 is the embedded output stage 600 (e.g., 503 of FIG. 5) of a multi-stage Johnson Counter based digitally phase locked LDO regulator 500, according to one embodiment of the disclosure. In one embodiment, embedded output stage 600/503 comprises overflow protection logic units 601 and 602, data FFs 603 and 604, level-shifters 605, 606, 607, and 608, and a driver stage including transistors MP1, MP2, MP3, and MP4.

In one embodiment, embedded output stage 600/503 performs implicit exclusive-OR (XOR) and overflow protection. In one embodiment, current flows from Vin to Vs when at least one of the two parallel paths are activated. In such an embodiment, both MP3 and MP4 are on, or both MP1 and MP2 are on. When MP3 and MP4 are on, it corresponds to Ri(AND)Si. When MP1 and MP2 are on, it corresponds to \Ri(AND)\Si. According, when both MP3 and MP4 are on, or both MP1 and MP2 are a logical XOR operation is performed.

In one embodiment, level shifters 605-608 allow the control logic and FFs including 601-604 to operate at lower power supply i.e., lower than Vin. In one embodiment, the data inputs to each stage are $S_{i-1}$ and $R_{i-1}$, where 'i' is an integer. In this embodiment, data $S_{i-1}$ and $R_{i-1}$ are latched by the FFs 603 and 604 respectively at the rising edges of SCLK and RCLK to generate $S_i$ and $R_i$. In one embodiment, by implicitly XOR-ing the signals $S_i$ and $R_i$ at each stage of RCLK and SCLK, the pass device pairs (MP1/MP2 and MP3/MP4) are kept turned on for a period of time that equals the phase difference between the signals at $S_i$ and $R_i$.

In one embodiment, overflow protection logic units 601 and 602 comprise logic that propagate $R_i$ when $S_i \neq R_i$, and propagate $S_i$ when $S_i = R_i$. In one embodiment, by allowing the control signals $S_i$, $R_i$, and their complements to be level-shifted at the output stage, the logic supply Vlogic to the first and second oscillators 501 and 502 and the Johnson Counter (part of 503) can be lowered below Vin to gain power efficiency.

In one embodiment, when both $S_i$ and $R_i$ are logically zero, their inverses are logically one which cause the outputs of level-shifters 605 and 606 to be logically zero, which in term turns on the p-type devices MP1 and MP2 while p-type transistors MP3 and MP4 are off. In one embodiment, when both $S_i$ and $R_i$ are logically one, their inverses are logically zero which cause the outputs of level-shifters 605 and 606 to be logically one, which in term turns off the p-type devices MP1 and MP2 while p-type transistors MP1 and MP2 are on.

Figure 7:
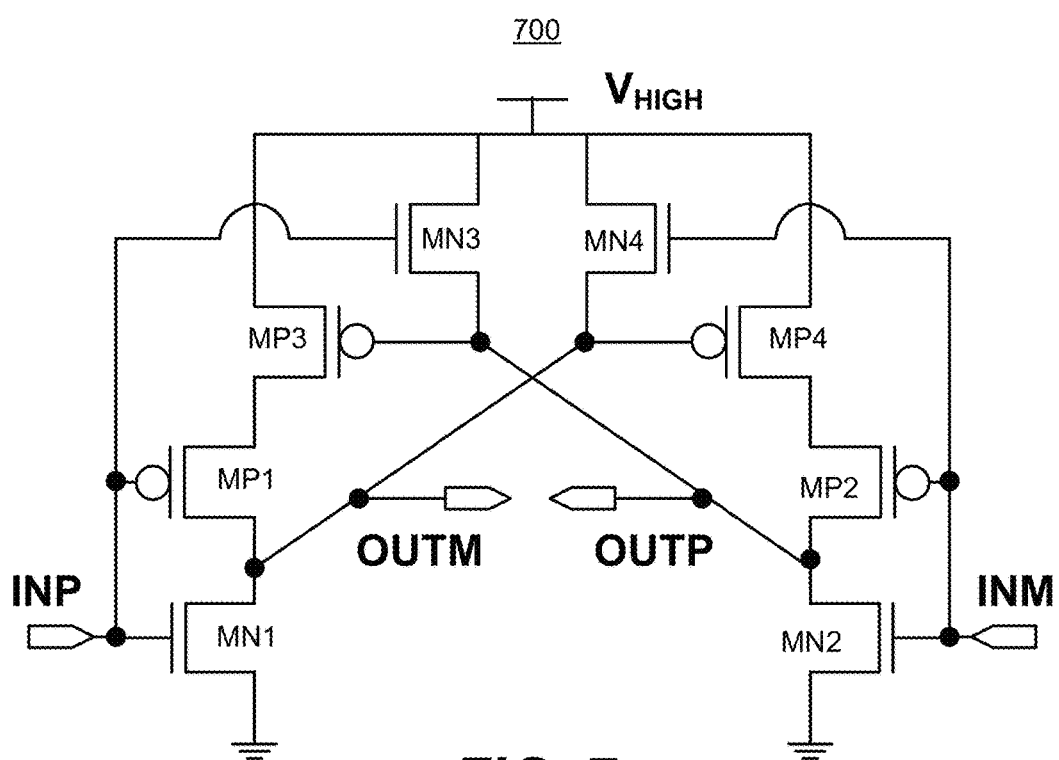
FIG. 7 is a level-shifter used in the multi-stage Johnson Counter based digitally phase locked LDO regulator, according to one embodiment of the disclosure.

FIG. 7 is a level-shifter 700 (e.g., 605-608 of FIG. 6) used in the multi-stage Johnson Counter based digitally phase locked LDO regulator 500, according to one embodiment of the disclosure. In one embodiment, level-shifter 700 comprises n-type transistors MN1, MN2, MN3, and MN4, and p-type transistors MP1, MP2, MP3, and MP4.

In one embodiment, n-type transistors MN1, MN2 which receive input signals INP and INM operate at power supplies lower than $V_{HIGH}$, where $V_{HIGH}$ is same as Vin of FIG. 5. In this embodiment, n-type transistors MN3 and MN4 also receive the input signals INP and INM. Transistors MP1 and MN1 form the first inverter generating OUTM (inversion of INP) while MP2 and MN2 form the second inverter generating OUTP (inversion of INM). In one embodiment, the output of the first inverter is received as input to MP4 which has its source terminal coupled to $V_{HIGH}$ and drain terminal coupled to the source terminal of MP2. In this embodiment, the output of the second inverter is received as input to MP3 which has its source terminal coupled to $V_{HIGH}$ and drain terminal coupled to the source terminal of MP1. In one embodiment, the outputs of the first and second inverters are also coupled to the source terminals of MN3 and MN4 respectively as shown.

While alternative level shifter structures may used in the embodiments discussed herein, level shifter 700 reduces the contention generally observed in the level shifters. For example, when INM goes high, MN2 and MN4 are turned on and MP2 is turned off. Correspondingly, INP goes low causing MN1 and MN3 to turn off and MP1 to turn on. Consequently, the node OUTP is pulled down to GND. As MN4 turns on and MN1 turns off, node OUTM is pulled up to Vlogic. Next, MP3 and MP1 are turned on and node OUTM makes full transition to VHIGH. Thus the level shifter 700 charges the output node in two stages, causing reduction in contention and results in a faster transition.

Figure 8A:
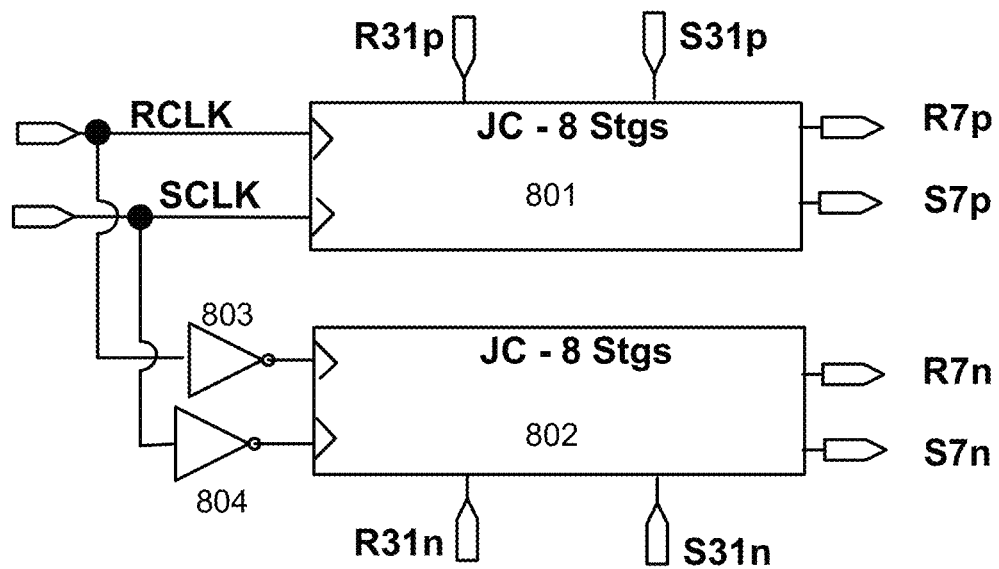
FIG. 8A is a section of the LDO including eight Johnson Counter stages operating on both edges of oscillator clocks, according to one embodiment of the disclosure.

FIG. 8A is a section 800 (e.g., 503a of FIG. 5) including eight Johnson Counter (part of 503) stages 801 and 802 operating on both edges of SCLK and RCLK, according to one embodiment of the disclosure. In one embodiment, the LDO 500 includes two identical counters (or substantially identical counters) in each section 800 (e.g., 503a of FIG. 5), where one counter is clocked on the rising edge and the other on the falling edge of RCLK and SCLK. In this embodiment, the first and second oscillators 501 and 502 operate at half the frequency without sacrificing transient response time.

In this embodiment, first part of the eight stages 801 operates on the rising edge of RCLK and SCLK while the second part of the eight stages 802 operates on the falling edge of RCLK and SCLK i.e., inverted versions of RCLK and SCLK via inverters 803 and 804. As shown in FIG. 5, first section 503a receives R31 and S31. In the embodiment of FIG. 8A, both positive (rising) and negative (falling) edges of R31 and S31 i.e., R31p/S31p and R31n/S31n are received by the first 801 and second 802 parts of the edge stages to generate latched outputs R7p/S7p and R7n/S7n.

Figure 8B:
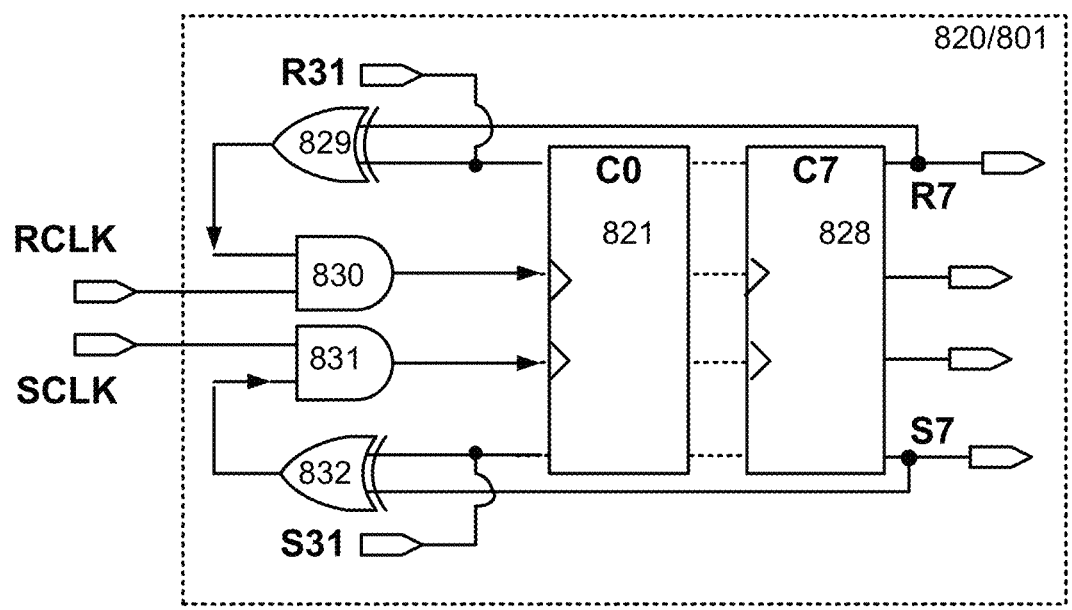
FIG. 8B is the clock gating mechanism of the Johnson Counter to reduce dynamic power consumption of the digitally phase locked LDO regulator, according to one embodiment of the disclosure.

FIG. 8B is the clock gating mechanism 820/801 of the Johnson Counter (part of 503) to reduce dynamic power consumption of the digitally phase locked LDO regulator 500, according to one embodiment of the disclosure. At any one time, one data FF is transitioning. Because the Johnson Counter propagates data one clock edge at a time, in one embodiment power savings are realized by clock gating each section (of the four sections) of the Johnson Counter in 503. In one embodiment, clock gating is achieved by logic gates 829, 830, 831, and 832 coupled together as shown.

In one embodiment, for each section, input and the output data nodes are compared. If the values of the input and output date nodes are not identical, it indicates that one FF inside this section is transitioning. In such an embodiment, the CLK (clock signal) to this section is provided. In one embodiment, if the input and the output nodes have the same logical value, it means that no FF in this section is making a transition. In such an embodiment, the CLK to this entire section can be gated to save unnecessary toggling of the FFs and this reduces the dynamic power of the design. Thus clock gating reduces dynamic power of the LDO 500.

FIG. 9A-C are waveforms 900, 920, and 930 that illustrate a transient operation of the digitally phase locked LDO regulator 500, according to one embodiment of the disclosure. In one embodiment, at steady-state condition (shown by FIG. 9A), phase difference 207 locks to a constant value such that the amount of current provided by the pull-up device(s), MP1 of FIG. 2 or MP1/MP2 and/or MP3/MP4 of FIG. 5, in this period of time matches the load current (consumed by load 204/504) and holds Vs or $V_{LDO}$ at Vref level. In such an embodiment, by phase locking each stage of the Johnson Counter, regulation is achieved.

For example, if a load transient causes the output voltage Vs to decrease below Vref, the second oscillator 602 responds by slowing down SCLK as shown by FIG. 9B. The dotted part of $S_0$ illustrates that a slower SCLK will change the pulse shape of $S_0$. Slowing SCLK causes the pulse $S_0$ to stretch as shown in FIG. 9C.

In one embodiment, stretching of $S_0$ perturbs the phase locking and additional phase difference is created in 207 between $S_0$ and $R_0$, allowing the pass device(s), MP1 of FIG. 2 or MP1/MP2 and/or MP3/MP4 of FIG. 5, to supply higher current to the load 204/504 until re-locking and regulation are again achieved. As discussed herein, in one embodiment, when LDO 500 is pushed far from lock, then RCLK and SCLK tend to overrun each other. The overrunning of RCLK and SCLK is prevented, in one embodiment, by collision detection and overrun protection logic units 601 and 602 of FIG. 6.

FIG. 10A is an oscillator 1000 (e.g., 501 and 502 of FIG. 5) for the digitally phase locked LDO regulator 500, according to one embodiment of the disclosure. In this embodiment, $V_{CTL}$ (Vref or Vs) controls the oscillation frequency of the oscillator. In one embodiment, the oscillator 1000 (e.g., 501 and 502) includes a multiplexer 1002 to provide a selection between 'N' stages and "N+1" stages of inverters (inverter indicated by 1001). While the embodiment herein shows an inverter 1001 as a building block of the oscillator, other devices (e.g., self biased VCO cell, differential amplifier, etc) may be used instead and/or in conjunction with 1001. In one embodiment, by programming the number of VCO stages, the gain of the VCO, KVCO, is controlled. A change in KVCO results in changes to the overall loop gain. In such an embodiment, the ability to program the VCO provides stability to the overall loop.

FIG. 10B is a current starved inverter 1020/1001 for the digitally phase locked LDO regulator 500, according to one embodiment of the disclosure. In one embodiment, current starving the first and second oscillators 501 and 502, as opposed to running the first and second oscillators 501 and 502 directly using $V_{CTL}$ (i.e., Vref and Vs) as supply, has multiple advantages. For Example, (a) Vref and Vs draw no current, and (b) output voltage levels of the VCO may not require level shifting before clocking the Johnson Counter.

In one embodiment, current starved inverter 1020/1001 comprises n-type transistors MN1, MN2 and p-type transistors MP1 and MP2 coupled together in series as shown. In one embodiment, $V_{CTL}$ is input to MN2 which causes the current starving of the inverter 1020. By adjusting the gate voltage of MN2, the propagation delay of the current starved inverter 1020/1001 changes and so the oscillation frequency of the oscillator 1000 changes.

Figure 11:
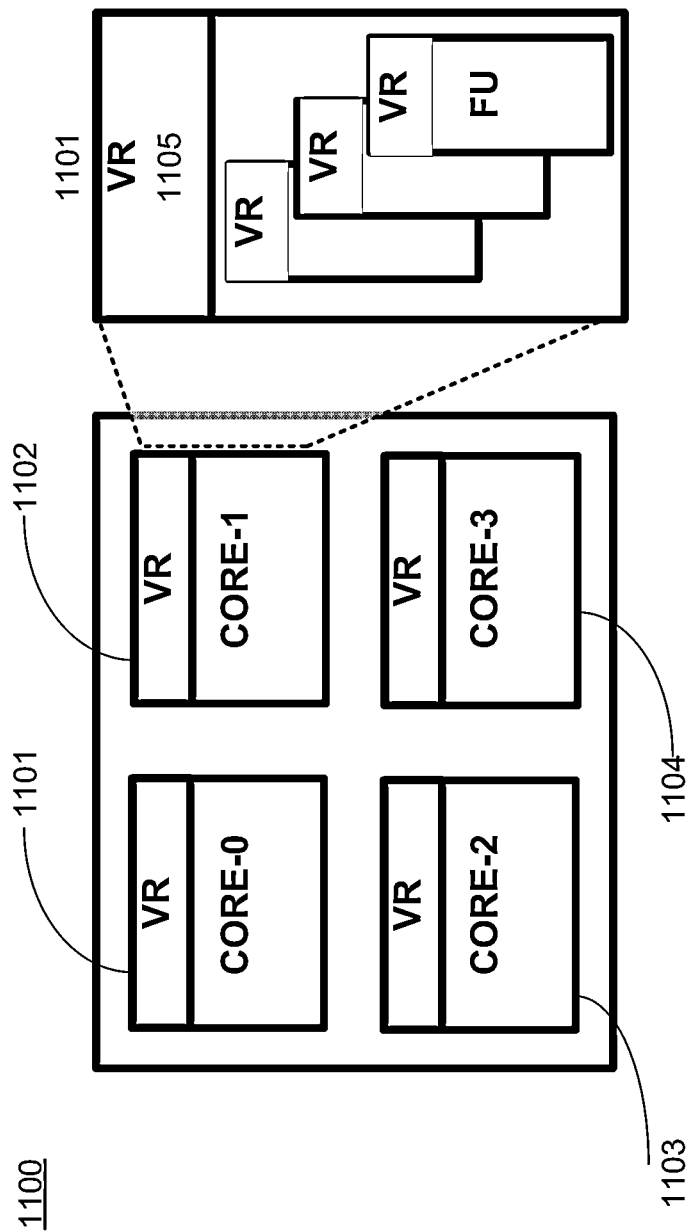
FIG. 11 is a processor with multiple processing cores and multiple digitally phase locked LDO regulator, according to one embodiment of the disclosure.

FIG. 11 is a processor 1100 with multiple processing cores 1101, 1101, 1103, and 1104 and multiple digitally phase locked LDO regulators, according to one embodiment of the disclosure. In one embodiment, each processing core (e.g., 1101) has its own digitally phase locked LDO regulator (e.g. 1005) as shown in the right part of FIG. 11. In other embodiments, a single VR may provide regulated power supply to multiple processing cores. In one embodiment, multiple VRs may be used to provide power supply to a single processing core.

Figure 12:
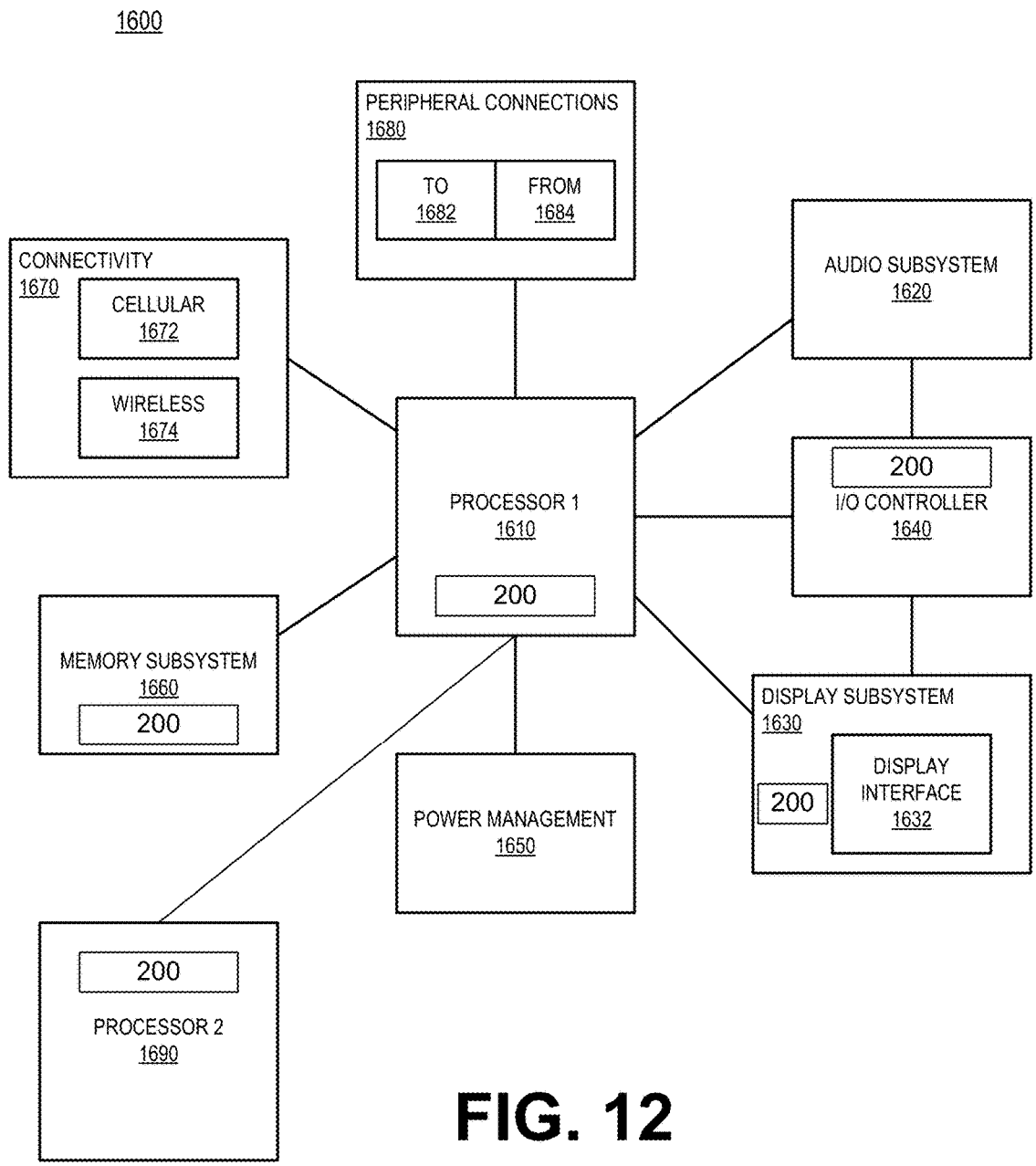
FIG. 12 is a system-level diagram of a smart device comprising a processor with the digitally phase locked LDO regulator, according to one embodiment of the disclosure.

FIG. 12 is a system-level diagram of a smart device 1600 comprising a processor with the digitally phase locked LDO regulator 200/500, according to one embodiment of the disclosure. FIG. 12 also illustrates a block diagram of an embodiment of a mobile device in which flat surface interface connectors could be used. In one embodiment, the computing device 1600 represents a mobile computing device, such as a computing tablet, a mobile phone or smart-phone, a wireless-enabled e-reader, or other wireless mobile device. It will be understood that certain components are shown generally, and not all components of such a device are shown in device 1600.

In one embodiment, the computing device 1600 includes a first processor 1610 with the digitally phase locked LDO 200/500 and a second processor 1690 with the digitally phase locked LDO 200/500, according to the embodiments discussed herein. The LDOs discussed herein can be used in conjunction with any other VR i.e., any other type of linear or switching regulator. The various embodiments of the present disclosure may also comprise a network interface within 1670 such as a wireless interface so that a system embodiment may be incorporated into a wireless device, for example, cell phone or personal digital assistant.

In one embodiment, the processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, the computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to device 1600 through which a user might interact with the system. For example, devices that can be attached to the computing device 1600 might include microphone devices, speaker or stereo systems, video systems or other display device, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem includes a touch screen, the display device also acts as an input device, which can be at least partially managed by I/O controller 1640. There can also be additional buttons or switches on the computing device 1600 to provide I/O functions managed by I/O controller 1640.

In one embodiment, the I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, the computing device 1600 includes power management 1650 that manages battery power usage, charging of the battery, and features related to power saving operation. Memory subsystem 1660 includes memory devices for storing information in device 1600. Memory can include nonvolatile (state does not change if power to the memory device is interrupted) and/or volatile (state is indeterminate if power to the memory device is interrupted) memory devices. Memory 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 1674 refers to wireless connectivity that is not cellular, and can include personal area networks (such as Bluetooth, Near Field, etc), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on device 1600. Additionally, a docking connector can allow device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or an element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented i.e., such specifics should be well within purview of one skilled in the art. Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, an apparatus comprises: a first oscillator to generate a first clock signal; a second oscillator to generate a second clock signal; a phase frequency detector to detect phase difference between the first and second clock signals, and to generate a phase difference; and an output stage, coupled to a load, to generate a power supply for the load according to the phase difference. In one embodiment, the output stage comprises a p-type transistor with a first terminal coupled to an input power supply and a second terminal to provide the power supply to the load, and a third terminal to receive the phase difference. In one embodiment, the first oscillator is controllable by a first reference generated by a reference generator. In one embodiment, the second oscillator is controllable by a second reference which corresponds to the power supply generated by the output stage for the load. In one embodiment, the first and second oscillators include equal number of delay stages. In one embodiment, the first and second oscillators are voltage controlled oscillators. In one embodiment, the phase frequency detector comprises a Johnson counter. In one embodiment, the load is a portion of a processor.

In another example, the apparatus comprises: a first oscillator to generate a first clock signal; a second oscillator to generate a second clock signal; and an N-bit Johnson Counter to generate N number of phases of the first and second clock signals, the N number of phases to directly or indirectly regulate power supply for one or more loads, where N is an integer. In one embodiment, the 'N' output drivers are embedded in the N-bit Johnson Counter. In one embodiment, each of the 'N' output drivers is operable to generate an output power supply for the one or more loads from an input power supply. In one embodiment, the 'N' output drivers generate N reference voltages for a common node having the output power supply, the output power supply for controlling the second oscillator. In one embodiment, the first oscillator is controllable by a first reference, wherein the second oscillator is controllable by a second reference, and wherein the first and the second references are generated from difference sources. In one embodiment, the first reference is generated by a reference generator, and wherein the second reference is generated according to a phase difference between the first and second clock signals. In one embodiment, the first and second oscillators comprise delay stages having current starved inverters. In one embodiment, the first and second oscillators are identical.

In another example, the apparatus comprises: a phase detector to detect phase difference between first and second clock signals generated from respective first and second oscillators, and to generate a phase difference; and an output stage, coupled to a load, to generate a power supply for the load according to the phase difference. In one embodiment, the phase detector is operable to generate a pulse modulated signal to represent the phase difference.

In one embodiment, the first and second oscillators have identical floor plans. In one embodiment, the first and second oscillators are voltage controlled oscillators, each including: a first chain of delay stages; a second chain of delay stages; and a multiplexer which is operable to select one of the first or second chain of delay stages according to a select signal, wherein the multiplexer and the first and second chain of delay stages are coupled together to form a loop.

In one embodiment, each of the delay stages in the first and second chains of delay stages comprises: a first p-type transistor coupled to a supply node; and a second p-type transistor coupled in series with the first p-type transistor, the first and the second p-type transistors to receive an input signal. In one embodiment, each of the delay stages in the first and second chains of delay stages further comprises: a first n-type transistor coupled in series with the first p-type transistor, the first n-type transistor to receive the input signal at its gate terminal. In one embodiment, each of the delay stages in the first and second chains of delay stages further comprises: a second n-type transistor coupled in series with the first n-type transistor, the second n-type transistor to receive a control signal to adjust current flow through the delay stage. In one embodiment, each of the delay stages in the first and second chains of delay stages comprises current starved inverters.

In another example, the apparatus comprises an output stage, to be coupled to a load, to generate a power supply for the load according to a phase difference between first and second clock signals generated from respective first and second oscillators. In one embodiment, the output stage comprises: a voltage level-shifter; and a p-type transistor coupled to the voltage level-shifter. In one embodiment, the output stage further comprises: an overflow protection logic to protect the apparatus when the first and second clocks signals overrun each other.

In another example, the apparatus comprises: an output stage, to be coupled to a load, to generate a power supply for the load according to a phase difference between first and second clock signals generated from respective first and second oscillators, wherein the output stage comprises: a voltage level-shifter; and a p-type transistor coupled to the voltage level-shifter. In one embodiment, the voltage level-shifter is a differential voltage level-shifter. In one embodiment, the voltage level-shifter to level-shift an input signal operating on a first power supply to an output voltage operating on a second power supply, wherein the second power supply is higher than the first power supply.

In another example, a system comprises: a memory; and a processor, coupled to the memory, the processor including multiple processing cores, each processing core having one or more low dropout regulators (LDOs) according to the apparatuses discussed herein. In one embodiment, the system further comprises a wireless interface for allowing the processor to communicate with other devices. In one embodiment, the system further comprises a display. In one embodiment, the output stage comprises a transistor with a first terminal coupled to an input power supply and a second terminal to provide the power supply to the load, and a third terminal to receive the phase difference.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first oscillator to generate a first clock signal;
   a second oscillator to generate a second clock signal;
   a phase frequency detector to detect phase difference between the first and second clock signals, and to generate a phase difference; and
   an output stage comprising a p-type transistor, coupled to a load, to generate a power supply for the load according to the phase difference, wherein a gate terminal of the p-type transistor is to receive the phase difference as a digital pulse,
   wherein the first and second oscillators include equal number of delay stages.

2. The apparatus of claim 1, wherein the p-type transistor comprises:
   a first terminal which is coupled to an input power supply; and
   a second terminal to provide the power supply to the load.

3. The apparatus of claim 1, wherein the first oscillator is controllable by a first reference generated by a reference generator.

4. The apparatus of claim 1, wherein the second oscillator is controllable by a second reference which corresponds to the power supply generated by the output stage for the load.

5. The apparatus of claim 1, wherein the first and second oscillators are voltage controlled oscillators.

6. The apparatus of claim 1, wherein the phase frequency detector comprises a Johnson counter.

7. The apparatus of claim 1, wherein the load is a portion of a processor.

8. An apparatus comprising:
   a first oscillator to generate a first clock signal;
   a second oscillator to generate a second clock signal; and
   an N-bit Johnson Counter to generate N number of phases of the first and second clock signals, the N number of phases to directly or indirectly regulate power supply for one or more loads, where N is an integer, and wherein the N-bit Johnson Counter comprises an embedded output stage which is to provide the regulated power supply.

9. The apparatus of claim 8 further comprises N output drivers are embedded in the N-bit Johnson Counter.

10. The apparatus of claim 9, wherein each of the N output drivers is operable to generate an output power supply for the one or more loads from an input power supply.

11. The apparatus of claim 9, wherein the N output drivers generate N reference voltages for a common node having the output power supply, the output power supply for controlling the second oscillator.

12. The apparatus of claim 8, wherein the first oscillator is controllable by a first reference, wherein the second oscillator is controllable by a second reference, and wherein the first and the second references are generated from difference sources.

13. The apparatus of claim 12, wherein the first reference is generated by a reference generator, and wherein the second reference is generated according to a phase difference between the first and second clock signals.

14. The apparatus of claim 8, wherein the first and second oscillators comprise delay stages having current starved inverters.

15. The apparatus of claim 8, wherein the first and second oscillators are identical.

16. A system comprising:
a memory;
a processor, coupled to the memory, the processor including multiple processing cores, each processing core having one or more low dropout regulators (LDOs), wherein the one or more LDOs comprise:
   a first oscillator to generate a first clock signal;
   a second oscillator to generate a second clock signal;
   a phase frequency detector to detect phase difference between the first and second clock signals, and to generate a phase difference; and
   an output stage comprising a p-type transistor, coupled to a load, to generate a power supply for the load according to the phase difference, wherein a gate terminal of the p-type transistor is to receive the phase difference as a digital pulse; and
a wireless interface to allow the processor to communicate with other devices.

17. The system of claim 16 further comprises a display.

18. An apparatus comprising:
a phase detector to detect phase difference between first and second clock signals generated from respective first and second oscillators, wherein the first and second oscillators include equal number of delay stages; and
an output stage, coupled to a load, to generate a power supply for the load according to the phase difference as a digital pulse.

19. The apparatus of claim 18, wherein the phase detector to generate a pulse modulated signal to represent the phase difference.

20. The apparatus of claim 18, wherein the first and second oscillators have identical floor plans.

21. The apparatus of claim 18, wherein the first and second oscillators are voltage controlled oscillators, each including:
a first chain of delay stages;
a second chain of delay stages; and
a multiplexer which is operable to select one of the first or second chain of delay stages according to a select signal, wherein the multiplexer and the first and second chain of delay stages are coupled together to form a loop.

22. The apparatus of claim 21, wherein each of the delay stages in the first and second chains of delay stages comprises current starved inverters.

23. An apparatus comprising:
an output stage, to be coupled to a load, to generate a power supply for the load according to a phase difference between first and second clock signals generated from respective first and second oscillators, wherein the output stage comprises a voltage level-shifter coupled to a control logic which is to operate at a supply lower than an input power supply, and wherein the input power supply is coupled to p-type transistor of the output stage.

24. The apparatus of claim 23, wherein the the p-type transistor is coupled to the voltage level-shifter.

25. The apparatus of claim 23, wherein the output stage further comprises an overflow protection logic to propagate a first control when the first control and a second control are unequal, and to propagate the second control when the first control and the second control are equal to each other.

26. The apparatus of claim 23, wherein the first oscillator is controllable by a first reference generated by a reference generator, and wherein the second oscillator is controllable by a second reference which corresponds to the power supply generated by the output stage for the load.

27. The apparatus of claim 23, wherein the first and second oscillators are voltage controlled oscillators.

* * * * *